United States Patent [19]
Webster et al.

[11] Patent Number: 5,399,923
[45] Date of Patent: Mar. 21, 1995

[54] FIELD PROGRAMMABLE GATE ARRAY DEVICE WITH ANTIFUSE OVERCURRENT PROTECTION

[75] Inventors: William S. Webster, Dallas; David D. Wilmoth, Plano, both of Tex.

[73] Assignee: Texas Instruments Incorporated, Dallas, Tex.

[21] Appl. No.: 96,324

[22] Filed: Jul. 26, 1993

[51] Int. Cl.⁶ ............... H03K 19/177; H01H 37/76
[52] U.S. Cl. ...................... 326/38; 327/525
[58] Field of Search .................. 307/202.1, 465; 340/825.84

[56] References Cited

U.S. PATENT DOCUMENTS

| | | | |
|---|---|---|---|
| 4,727,266 | 2/1988 | Fujii et al. | 307/451 |
| 4,758,745 | 7/1988 | Elgamal et al. | 307/465 |
| 5,171,715 | 12/1992 | Husher et al. | 437/190 |
| 5,293,133 | 3/1994 | Birkner et al. | 307/202.1 |
| 5,304,871 | 4/1994 | Dharamarajan et al. | 307/465 |

OTHER PUBLICATIONS

Chen, John Y.; CMOS Devices and Technology for VLSI; ©1990 by Prentice-Hall, Inc., p. 98.

*Primary Examiner*—Edward P. Westin
*Assistant Examiner*—Benjamin D. Driscoll
*Attorney, Agent, or Firm*—Warren L. Franz; Wade J. Brady, III; Richard L. Donaldson

[57] ABSTRACT

A field programmable gate array (10) having a plurality of logic modules (31–35) has a pair of driver circuits (51–52) connected between each logic module (31) and logic module interconnection tracks or lines (12–16, 20–23) (51–52). Each of the drivers (51–52) has an input connected to receive a common output signal from the associated logic module (31). The output from each of the driver circuits (51–52) is selectively connectable to one of the interconnection tracks by a different respective antifuse (27). The output of each driver circuit (51–52) has a current magnitude less than a level that would damage the antifuse (27) but greater than a predetermined level, so that the track capacitances can be charged as rapidly as possible to increase the propagation time of a signal in the array. In one embodiment (10), the respective logic module interconnection lines or tracks 12 to which the pair of antifuses are connected are different logic module interconnection lines (12, 13). In another embodiment (150), the respective logic module interconnection lines to which the pair of antifuses (185, 186) are connected are the same logic module interconnection line or track (186).

21 Claims, 3 Drawing Sheets

FIELD PROGRAMMABLE GATE ARRAY DEVICE WITH ANTIFUSE OVERCURRENT PROTECTION

BACKGROUND OF THE INVENTION

1. Field of the Invention

This invention relates to field programmable gate array integrated circuit devices, and, more particularly, to improvements in field programmable gate array devices that employ antifuse programming elements that have maximum current constraints.

2. Relevant Background

In the construction of field programmable gate arrays (FPGAs), many logic modules are provided in spaced rows between sets of interconnection tracks on an integrated circuit chip. Output lines from the various logic modules extend across one or more sets of the interconnection tracks, and programmable elements are provided that can be configured by a user selectively to connect the output lines to a desired interconnection track. Corresponding connections can be made up or downstream on the track. Thus, any particular logic module can be selectively connected to any particular other logic module on the chip, as needed by the user.

The programmable elements to establish the selective connections between the output lines and the tracks can be provided by devices known in the art as "antifuses." In most antifuses, when a particular high current flows through the antifuse, it shorts to establish a permanent connection for carrying currents below a particular current level. But if a subsequent current of sufficient size passes through a completed antifuse, the integrity of the antifuse connection may be degraded, or even destroyed. This is particularly true in antifuses constructed of metal elements separated by amorphous silicon. Thus, antifuses fabricated with certain antifuse technologies may inadvertently open after being programmed. This is true even in normal circuit operations, for example, when a driver/load combination is such that a current spike rises to a level above a particular threshold. Unfortunately, for many present technologies, this current threshold is well below the level produced in normal circuit operations.

Also, in the construction of FPGAs it will be appreciated that the interconnection tracks extend considerable distances over the array, and may have a high capacitance associated with them. Additionally, the antifuses themselves are physically constructed much like capacitors, and may add to the capacitance of any particular interconnection track. As a result, despite the presence of segmenting transistors that may be provided to reduce the capacitance along the length of the interconnection tracks, a sufficiently high drive current must be applied to move a logic signal through the circuit so that the capacitive effects appearing on the line do not adversely affect the propagation time of the logic signal through the array. To provide such drive current, in the design of many gate arrays, an output driver circuit is commonly provided to receive an output logic signal from one logic module for connection to drive another logic module, or perhaps to a circuit output.

However, in view of the antifuse constraints described above, the drivers receiving the output signals from the logic modules must be reduced in size to comply with the maximum current constraint imposed by the antifuse. In turn, the propagation delays are greatly increased over those of circuits in which a sufficiently high drive current exists. Therefore, it has become necessary to introduce schemes that may meet the programmed antifuse restrictions without greatly increasing propagation delays.

The problem is sometimes further complicated by the fact that in the design of many gate arrays, designers commonly want to configure an output driver circuit to drive more than one output circuit. In such cases, because of the antifuse limitations described above, the level of the output driver current must be reduced even further not to exceed the worst case antifuse current handling limitations. For example, if an output is fanned out to include four selectable lines, the output driver must provide sufficient drive current to all four lines. Also, the output must be sufficiently low so as not to damage an antifuse structure if only one line is selected. This results in a design constraint producing undesirably slow propagation delays.

One solution proposed to solve this problem has been to provide a drive circuit that can dynamically change the output current from the drivers to provide a predetermined constant high value, despite the load or line capacitances to which it may be connected. Such amplifier designs are not particularly simple or inexpensive. When multiplied over a large array, the cost, complexity and fabrication problems of the device are greatly increased.

Examples of field programmable gate arrays in which the invention described below can be incorporated are the FPGA family of devices known as Act I or Act II, sold by Actel, Corporation, of Sunnyvale, Calif., or similar devices.

SUMMARY OF THE INVENTION

Considering the above, it is, therefore, an object of the invention to provide an improved output architecture for use in circuits having antifuse drive constraints.

It is another object of the invention to provide an improved output architecture that meets the programmed antifuse restrictions without greatly increasing propagation delays.

These and other objects, features and advantages of the invention will be apparent to those skilled in the art from the following detailed description of the invention, when read in conjunction with the accompanying drawings and appended claims.

According to a broad aspect of the invention, an improved field programmable gate array (FPGA) is provided. The FPGA is of the type having a plurality of logic modules, a pair of lines for selectively interconnecting the logic modules, and a pair of driver circuits. Each of the driver circuits has an input and an output with the respective inputs being each connected to receive a common output signal from a same one of the logic modules. The output from each of the driver circuits has a current magnitude less than a first predetermined threshold current level, for example, a level that would damage an antifuse, and greater than a second predetermined level. The second predetermined level can be greater than half that current magnitude of the first predetermined level. A pair of antifuses is interposed between respective driver circuit outputs and logic module interconnecting lines. The antifuses provide means for selectively connecting selected logic modules in the formation of a user defined logic circuit. In one embodiment, the respective logic module interconnection lines to which the pair of antifuses is connected are different. In another embodiment, the respective logic module interconnection lines to which the pair of antifuses is connected are the same.

According to another broad aspect of the invention, a field programmable gate array has a plurality of logic modules, first and second sets of lines for interconnecting selected logic modules, and a number, greater than one, of driver circuits. Each of the driver circuits has an input connected to receive an output signal from a same one of the logic modules. The driver circuit outputs are connectable by an antifuse to a line in the first or second sets of lines for logic module interconnection. The driver circuit outputs have a current magnitude less than a level that would damage the antifuse but greater than the current magnitude that would damage the antifuse divided by the number of drivers.

In accordance with yet another broad aspect of the invention, a method for operating a field programmable gate array having a plurality of logic modules and logic module interconnection lines includes providing a pair of driver circuits each having an input and an output. The respective inputs of each driver circuit of the pair are connected to receive a common output signal from a same one of the logic modules. The output from each of the driver circuits is established to provide a current magnitude less than a threshold level that would damage an antifuse and greater than a predetermined current magnitude. A pair of antifuses is arranged between respective outputs of the driver circuits and respective ones of the logic module interconnection lines for selectively connecting selected logic modules in the formation of a user defined logic circuit. In one embodiment, the predetermined current magnitude is greater than one-half the threshold current magnitude that would damage an antifuse. In another embodiment, the predetermined current magnitude is less than one half the threshold current magnitude that would damage an antifuse. In one embodiment, the step of arranging a pair of antifuses between respective outputs of the driver circuits and respective ones of the logic module interconnection lines for selectively connecting elected logic modules in the formation of a user defined logic circuit, comprises arranging the antifuses to connect to different logic module interconnection lines. In another embodiment, the step of arranging a pair of antifuses between respective outputs of the driver circuits and respective ones of the logic module interconnection lines for selectively connecting elected logic modules in the formation of a user defined logic circuit, comprises arranging the antifuses to connect to a same logic module interconnection line.

BRIEF DESCRIPTION OF THE DRAWINGS

The invention is illustrated in the accompanying drawings in which.

DESCRIPTION OF THE PREFERRED EMBODIMENTS

Figure 1:
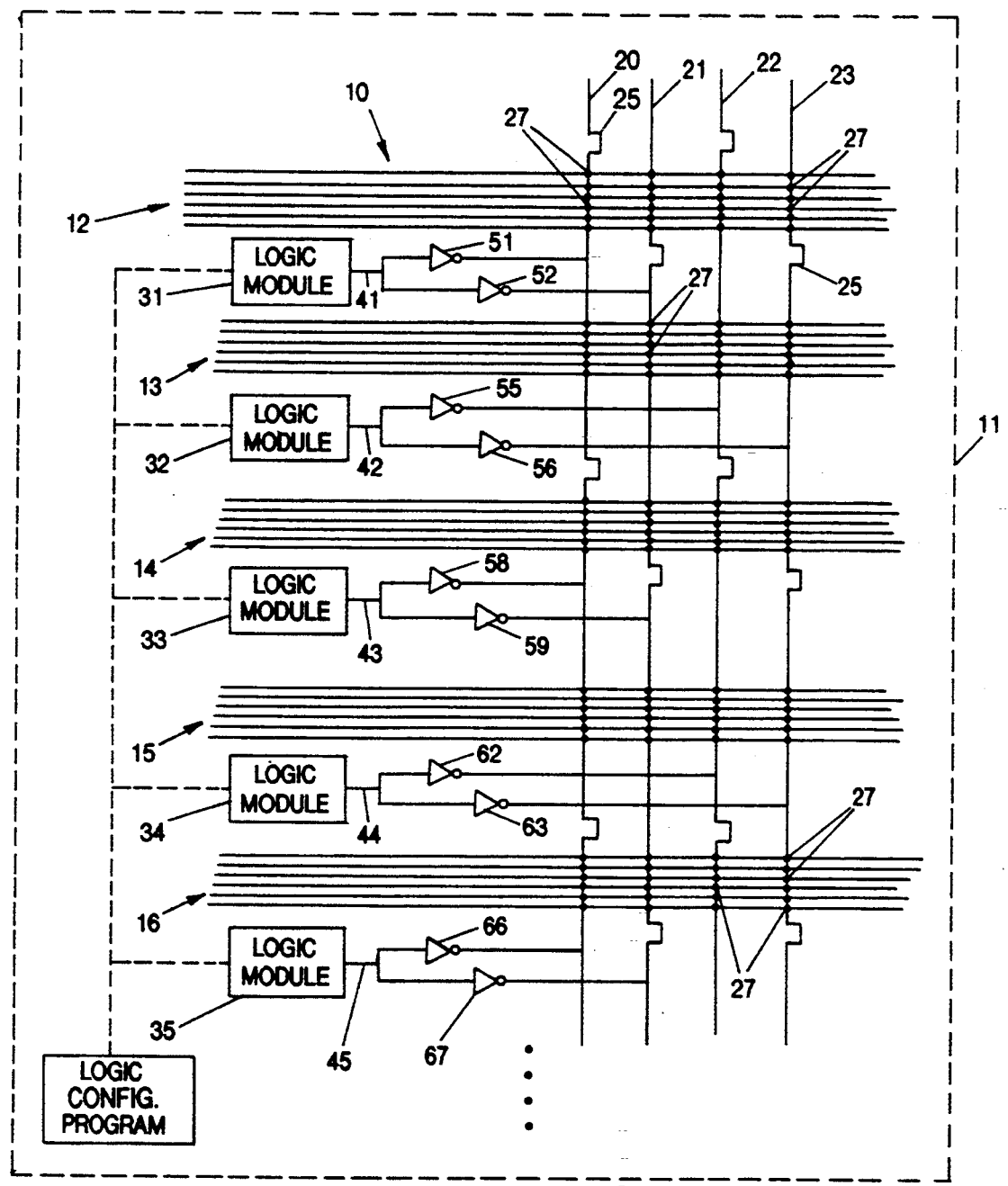
FIG. 1 is an electrical schematic diagram of part of a field programmable gate array showing a preferred embodiment of the invention.

A part of a field programmable gate array (FPGA) 10 constructed on an integrated circuit chip 11 is shown in FIG. 1. As known, many sets of horizontal tracks, such as the tracks in the track sets 12, 13, 14, 15, and 16 shown, may be provided to which selective electrical connections can be selectively made by the user between various circuits at various locations on the chip 11. Each of the track sets 12-16 has a plurality of individual tracks, such as the six tracks shown.

Crossing the horizontal track sets 12-16 are vertical tracks 20, 21, 22, and 23. Although only four vertical tracks 20-23 are shown, other numbers of tracks can be used; moreover, other sets of vertical tracks can be formed crossing the horizontal track sets at spaced horizontal locations. The vertical tracks 20-23 are segmented by segmenting transistors 25 to electrically isolate portions or segments of the vertical tracks between each transistor to reduce the total capacitance of the individual segments. (As known, the transistors 25 are necessary to enable the FPGA 10 to be initially programmed.)

An antifuse 27 is provided at each intersection of the horizontal tracks in the horizontal track sets 12-16 with the vertical tracks 20-23. The antifuses 27 are denoted by a dot at the track intersections shown in FIG. 1. The antifuses 27 are configured to be selectively "blown" to establish an electrical connection between the horizontal and vertical tracks at the antifuse location.

The FPGA 10 also includes a plurality of logic modules 31-35 of known construction. The logic modules receive logic signals from other portions of the FPGA 10, such as from other logic modules, or from signals externally applied to input terminals to the chip 11 (not shown). The logic modules 31-35 are programmable to perform various software configurable logic functions. The outputs from each of the logic modules 31-35 are produced on respective single output lines 41-45. The output lines 41-45, in turn, according to the invention, are applied to the respective inputs of driver pairs 51-52, 55-56, 58-59, 62-63, 66-67.

Each driver of the driver pairs 51-52, 55-56, 58-59, 62-63, and 66-67 is sized such that it provides as high a driving current as possible to the particular segmented portion of the vertical lines 20-23 to which it is connected. Thus, the relative size of each driver of the pair can be such that it provides a drive current that is larger than one-half of the maximum drive current that can safely be applied to one of the antifuses, but less than the current level that would harm the antifuse to which it might be connected. (Note, that the FPLAs heretofore required that their drivers supply a drive current less than one-half of the critical antifuse current if there were any possiblity that a driver might be selectively connected to either one or two antifuses.) Thus, the total drive that is provided by each driver provides a relatively high current to rapidly charge the capacitances in the lines to which it may be connected, yet is still sufficiently low as to not damage any antifuse to which it may be connected.

Although the embodiment 10 shown in FIG. 1 shows only four vertical tracks to which the respective drivers are connected, it will be understood that the number of tracks can be increased with TI-17580 PATENT APPLICATION a corresponding increase in the number of drivers associated with each of the logic modules.

Thus, for example, if four drivers are associated with each logic module, six vertical tracks may be employed to provide improved FPGA capability and speed performance.

Figure 2:
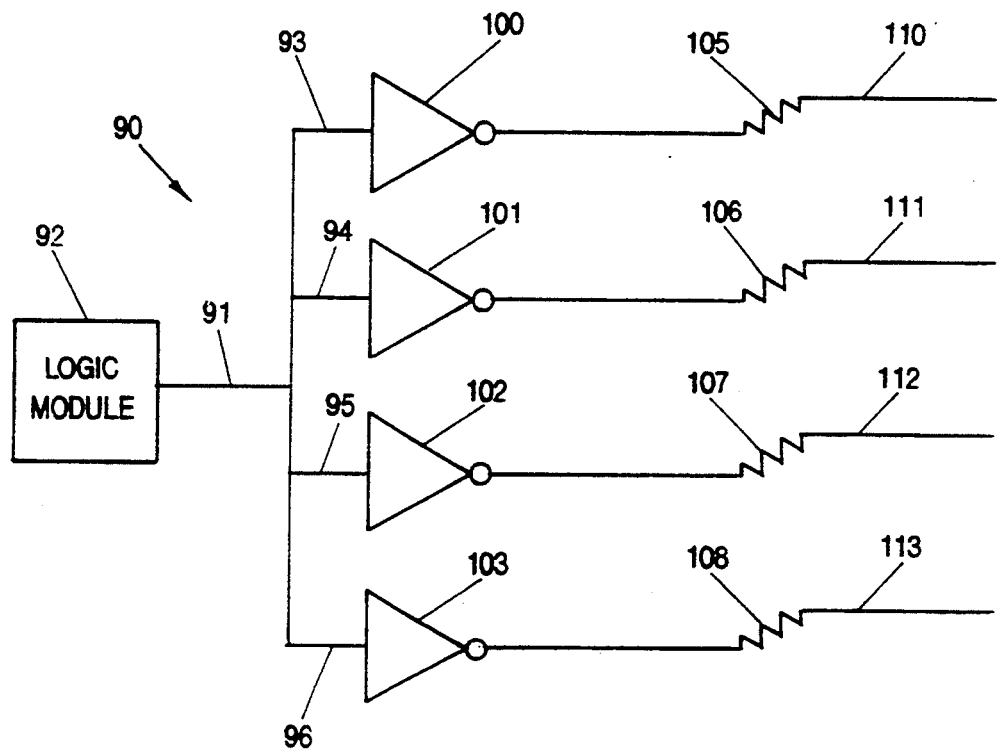
FIG. 2 is an electrical schematic diagram of a circuit in which a plurality of drivers is connected to a single logic module output line.

For example, an embodiment 90 of a driver circuit in which an output on an output line 91 from a logic module 92 is fanned out to four output lines is shown in FIG. 2. The four output lines 9396, each connected to the single output line 91 from the logic module 92, are applied to the respective inputs of drivers 100-103. The outputs from the drivers 100-103 are applied via respective antifuses 105-108 to output lines 110-113. The lines 110-113 may correspond, for example, to one of the horizontal tracks of the FPGA, similar to the tracks of track sets 12-16 described with respect to FIG. 1 above.

In the circuit embodiment shown in FIG. 2, the drivers 100-103 may be designed to provide an output current that is higher than that otherwise required if only single output drivers were employed. Thus, for example, in the embodiment 90 of FIG. 2, the output current of each of the driver amplifiers 100-103 may be larger than one-quarter of the output of any individual driver, but less than the current that would produce a current magnitude that would deleteriously affect the antifuse to which it may be connected. This design flexibility would not be available, for example, using prior art designs, in which a single driver would need to be designed to have an output current less than one-fourth of the current that would adversely affect an antifuse to which it may be connected. The improvement realized by the design of the invention, therefore, allows a much higher ratio of drive current to the damaging current threshold. This, in turn, significantly reduces the propagation delay of the device since the track capacitances are rapidly charged in the operation of the drivers.

Figure 3:
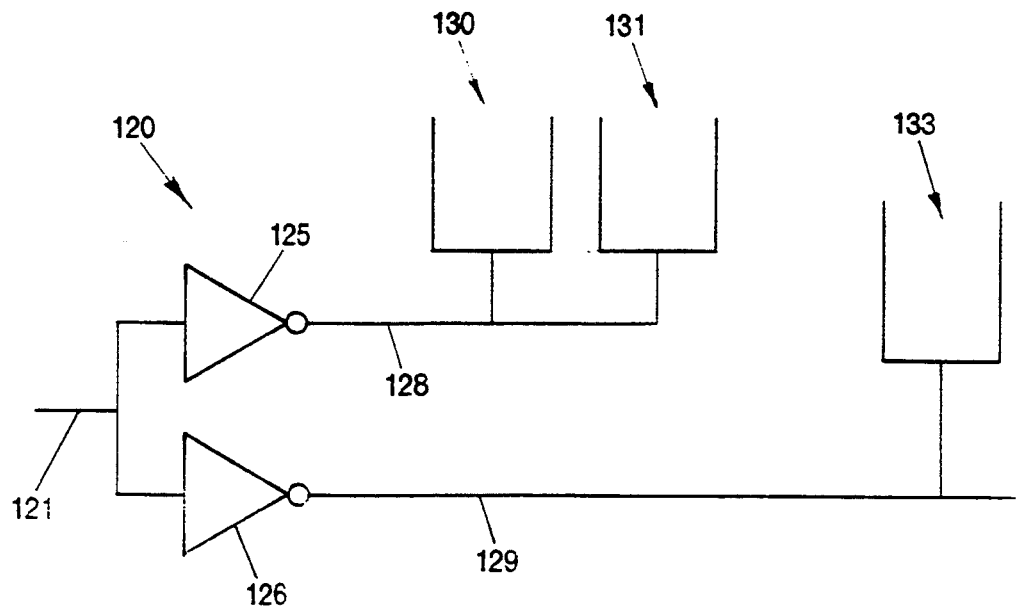
FIG. 3 is an electrical schematic diagram of part of a circuit that is useful in a field programmable gate array in which a single output line from a logic module is fanned out to many circuit lines.

Other circuit embodiments can be envisioned that employ the principles of the invention. As an example, as shown in FIG. 3, a circuit 120 is provided that receives as an input on line 121, an output signal from a logic module (not shown). The signal on the line 121 is applied to pair of drivers 125 and 126 to provide outputs on respective output lines 128 and 129. The signals on the output lines 128 and 129 are then fanned out in fan-out networks 130 and 131 on the output line 128 and fan-out network 133 on the output line 129. Since two drivers 125 and 126 are provided, each can be constructed to provide a larger drive current than either driver alone, if only one driver were used, without risking potential damage to associated antifuses.

Figure 4:
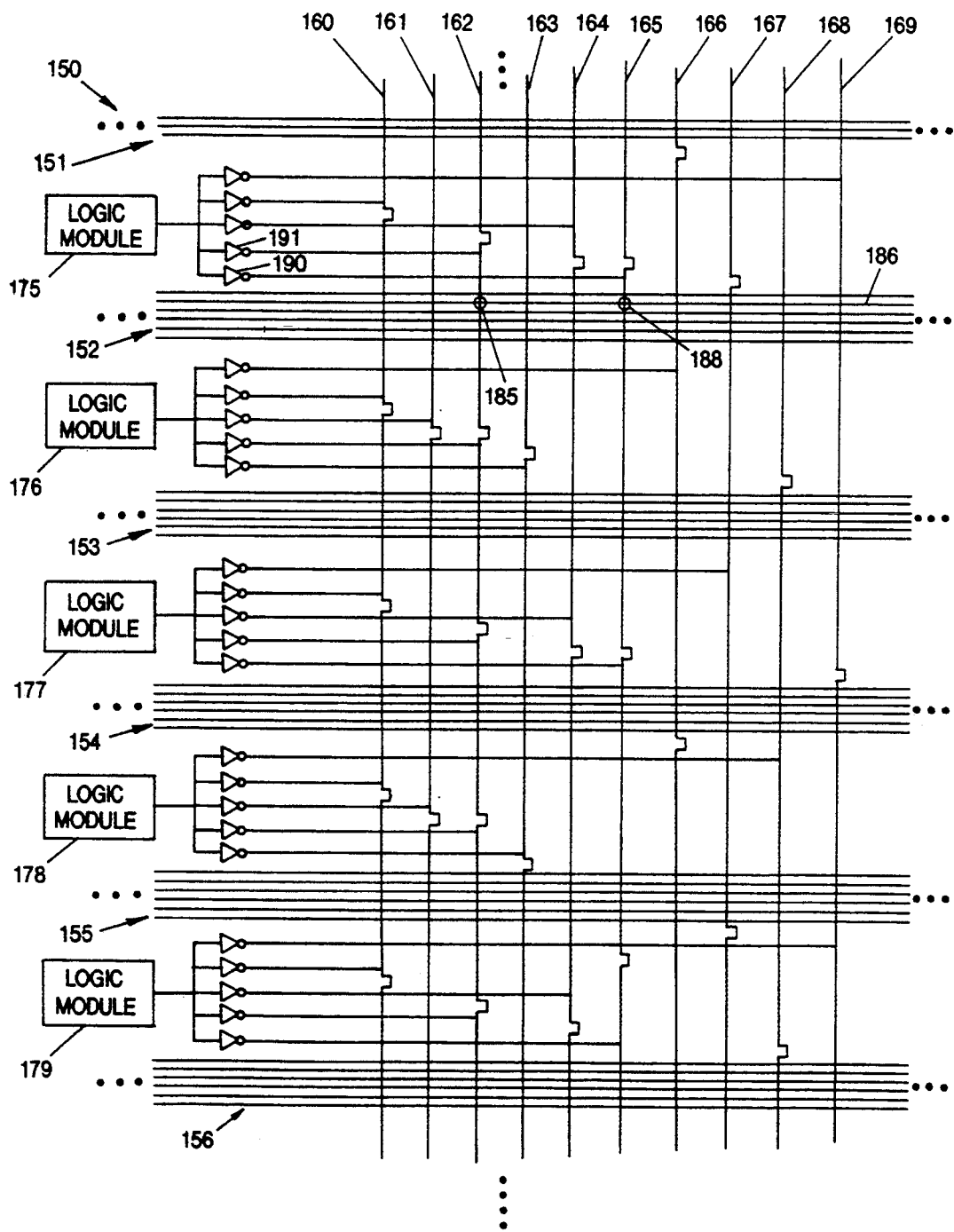
FIG. 4 is an electrical schematic diagram of part of a field programmable gate array in which plural drivers may be interconnected to a single output line according to another preferred embodiment of the invention.

Another circuit embodiment 150 is shown in FIG. 4. The circuit 150 in FIG. 4 is part of an FPGA in which the various drivers can be connected with two or more drivers selectively connectable to drive a single track or line. The circuit 150 includes many horizontal track sets, such as track sets 151-156, for which connection can be selectively made to one or more of the vertical tracks 160-169 at an antifuse (not shown) at the respective intersections between them.

The circuit 150 includes many programmably configurable logic modules 175-179, each having an output that feeds the inputs of five driver circuits that are variously connected to the vertical tracks 160-169 as shown. To interconnect, for example, two of the drivers at the output of the logic module 175, the antifuse connected at the intersection 185 between the vertical track 162 and the horizontal track 186 can be blown. In addition, for example, the antifuse at the intersection 188 between the vertical track 165 and the horizontal track 186 can be blown. Thus, the current produced on the horizontal track 186 represents a current value equal to the sum of the currents supplied by the drivers 190 and 191 at the output from the logic module 75. Yet the current supplied by either driver 190 or 191 by itself is less than the damaging current threshold that may damage an antifuse to which the driver may be connected. This architecture may be useful, for example, if the signal on line 186 is to be used downstream or upstream on the set of horizontal tracks 152 that requires an increased drive current.

It will be appreciated, of course, that many other connection combinations can be set up with the circuit as shown in FIG. 4. Thus, in the circuit embodiment of FIG. 4, the drivers at the output of each of the logic modules 175-179 can be designed to provide a total lower drive current than would be required if a single driver were used to supply the drive current, for instance, on track 186. Thus, as shown, the drivers can be designed to provide a drive current of approximately one-half the current required if a single driver were used. This subjects the antifuse by which the driver is connected to the horizontal track to a drive current significantly less than the current that would damage the antifuse, without sacrificing the total current provided in the horizontal track 186.

Other combinations may be similarly employed to enable the connection of additional drivers to the output lines. This would provide, for example, various multiples of the drive current provided by each driver, such as 4, 8, or the like.

It should also be noted that in the circuit embodiment described above with respect to FIG. 1 the driver circuits associated with a single logic module are preferably constructed to provide a drive current that is greater than one-half the drive current that would damage an antifuse if it were to be applied thereto. In distinction, the circuit embodiment of FIG. 4 can be constructed similarly, or, if desired, the individual drive circuits can be constructed to provide essentially any drive current that can be less than the current that would damage an antifuse, even less than one-half the antifuse damaging current, since it will be added to the current from the other drivers connected to the common output line. Thus, in either embodiment, the output current from the driver circuits can be adjusted to provide a sufficient drive current to charge the capacitances of the various tracks to which it may be connected as rapidly as possible, without adversely affecting any antifuse elements through which the current may pass.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A field programmable gate array having a plurality of logic modules, comprising:
   a pair of logic module interconnection lines;
   a pair of driver circuits, each of said driver circuits having an input and an output; the respective inputs being each commonly connected to receive a same output signal from a selected one of said logic modules; and a pair of antifuses interposed between respective ones of said outputs of said driver circuits and at least one of said logic module interconnection lines, for selectively connecting said Selected one of said logic modules with said logic module interconnection lines in the formation of a user-defined logic circuit.

2. The circuit of claim 1, wherein said output from each of said driver circuits has a current magnitude less than a predetermined threshold current level that would damage an associated one of said antifuses, but greater than one-half of said predetermined threshold current level.

3. The circuit of claim 1, wherein said output from each of said driver circuits has a current magnitude less than a predetermined threshold current level that would damage an associated one of said antifuses, but less than one-half of said predetermined threshold current level.

4. The circuit of claim 1, wherein said antifuses are respectively connected to different ones of said logic module interconnection lines.

5. The circuit of claim 1, wherein said antifuses are respectively connected to a same one of said logic module interconnection lines.

6. The circuit of claim 1, wherein said logic modules are individually configurable.

7. A field programmable gate array having a plurality of logic modules, comprising:
   first and second sets of logic module interconnection lines;
   a pair of driver circuits, each of said driver circuits having an input and an output; the respective inputs being each commonly connected to receive a same output signal from a selected one of said logic modules; and
   first and second sets of antifuses interposed between respective ones of said outputs of said driver circuits and logic module interconnection lines of at least one of said first and second sets of said logic module interconnection lines, said antifuses providing means for selectively connecting said selected one of said logic modules to corresponding selected one of said logic module interconnection lines.

8. The field programmable gate array of claim 7, further comprising third and fourth sets of logic module interconnection lines, and third and fourth sets of antifuses interposed between respective ones of said outputs of said driver circuits and logic module interconnection lines of at least one of said third and fourth sets of said logic module interconnection lines.

9. A method for operating a field programmable gate array having a plurality of logic modules and logic module interconnection lines, comprising:
   providing a pair of driver circuits, each of said driver circuits having an input and an output;
   commonly connecting the respective inputs of each driver circuit of said pair to receive a same output signal from a selected one of said logic modules;
   establishing the output from each of said driver circuits to provide a current magnitude less than a threshold current level that would damage an antifuse, but greater than a predetermined current magnitude; and
   arranging a pair of antifuses between respective outputs of said driver circuits and at least one of said logic module interconnection lines, for selectively connecting said selected one of said logic modules with said module interconnection lines in the formation of a user-defined logic circuit.

10. The method of claim 9, wherein said predetermined current magnitude is greater than one-half said threshold current magnitude that would damage an antifuse.

11. The method of claim 9, wherein said predetermined current magnitude is less than one-half said threshold current magnitude that would damage an antifuse.

12. The method of claim 9, wherein said step of arranging said pair of antifuses comprises arranging said antifuses to respectively connect said selected logic module to different ones of said logic module interconnection lines.

13. The method of claim 9, wherein said step of arranging said pair of antifuses comprises arranging said antifuses to respectively connect said selected logic module to a same logic module interconnection line.

14. A field programmable gate array, comprising:
   a plurality of first tracks;
   a plurality of second tracks crossing said first tracks at intersections;
   an antifuse provided at each intersection of said first and second tracks; said antifuses being configured to be selectively blown to establish selected electrical connections at said intersections between selected ones of said first and second tracks; and said antifuses being characterized by critical threshold current ratings defining currents above which said antifuses may be damaged;
   a plurality of logic modules having output lines, respectively arranged to receive input logic signals from other elements on said gate array and to deliver output signals to said output lines;
   a plurality of driver circuits attached to each of said output lines; said driver circuits having inputs commonly connected to said output lines and outputs respectively connected to different ones of said second tracks so that multiple connections between a selected logic module output line and a selected first track can be established through said plurality of driver circuits by selectively blowing different ones of said antifuses connecting said different ones of said second tracks to said selected first track; whereby total current greater than said critical threshold current can be flowed from said selected logic module output line to said selected first track, without flowing current greater than said critical threshold current through any of said different ones of said antifuses.

15. A gate array as defined in claim 14, wherein said plurality of first tracks comprises a plurality of horizontal tracks, and said plurality of second tracks comprises a plurality of vertical tracks.

16. A gate array as defined in claim 15, further comprising a plurality of segmenting transistors connected to electrically isolate said vertical tracks into segments.

17. A gate array as defined in claim 14, wherein at least some of said second tracks comprise fan-out networks having first ends commonly connected to the output of associated ones of said driver circuits and second ends crossing said first tracks at different respective intersections; whereby total current greater than said critical threshold current can be flowed from said selected logic module output line through said associated ones of said driver circuits, without flowing current greater than said critical threshold current through any of said different ones of said antifuses.

18. A method of operating a field programmable gate array; said gate array comprising a plurality of first tracks; a plurality of second tracks crossing said first tracks at intersections; an antifuse provided at each intersection of said first and second tracks, said antifuses being characterized by a critical threshold current ratings defining currents above which said antifuses may be damaged; and a plurality of logic modules having output lines, respectively arranged to receive input logic signals from other elements on said gate array and to deliver output signals to said output lines; said method comprising the steps of:

providing a plurality of driver circuits attached to each of said output lines; said driver circuits having inputs commonly connected to said output lines and outputs respectively connected to different ones of said second tracks;

selectively blowing different ones of said antifuses connecting said different ones of said second tracks to a selected one of said first tracks to establish multiple connections between a selected logic module output line and said selected first track through said associated plurality of driver circuits;

flowing a total current greater than said critical threshold current from said selected logic module output line to said selected first track, without flowing current greater than said critical threshold current through any of said different ones of said antifuses.

19. A method as in claim 18, wherein a number "n" of driver circuits are provided attached to each output line in said providing step, and current greater than said critical threshold current divided by said number "n" is flowed through each of said "n" driver circuits in said flowing step.

20. A method as in claim 18, wherein two driver circuits are provided attached to each output line in said providing step, and current greater than one-half of said critical threshold current is flowed through each of said two driver circuits in said flowing step.

21. A gate array as defined in claim 18, wherein at least some of said second tracks comprise fan-out networks having first ends commonly connected to the output of associated ones of said driver circuits and second ends crossing said first tracks at different respective intersections; and wherein, in said flowing step, total current greater than said critical threshold current is flowed from said selected logic module output line through at least one of said associated ones of said driver circuits, without flowing current greater than said critical threshold current through any of said different ones of said antifuses.

* * * * *